(12) United States Patent
Lee et al.

(10) Patent No.: US 8,183,112 B2
(45) Date of Patent: May 22, 2012

(54) METHOD FOR FABRICATING SEMICONDUCTOR DEVICE WITH VERTICAL CHANNEL

(75) Inventors: Min-Suk Lee, Ichon-shi (KR);
Hong-Gu Yi, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 1194 days.

(21) Appl. No.: 11/951,218

(22) Filed: Dec. 5, 2007

(65) Prior Publication Data

US 2009/0004861 A1   Jan. 1, 2009

(30) Foreign Application Priority Data

Jun. 26, 2007   (KR) .................. 10-2007-0062782

(51) Int. Cl.
*H01L 21/302* (2006.01)
(52) U.S. Cl. ......... 438/270; 438/691; 438/696; 438/702
(58) Field of Classification Search .................. None
See application file for complete search history.

(56) References Cited

U.S. PATENT DOCUMENTS

| 6,013,548 | A | 1/2000 | Burns, Jr. et al. | |
|---|---|---|---|---|
| 7,488,651 | B2 * | 2/2009 | Tang et al. | 438/268 |
| 2006/0097304 | A1 * | 5/2006 | Yoon et al. | 257/307 |
| 2007/0080385 | A1 * | 4/2007 | Kim et al. | 257/296 |
| 2007/0082448 | A1 * | 4/2007 | Kim et al. | 438/268 |
| 2007/0087499 | A1 | 4/2007 | Seo et al. | |

FOREIGN PATENT DOCUMENTS

| CN | 1434515 | 8/2003 |
|---|---|---|
| JP | 10-256510 | 9/1998 |
| KR | 1020060041415 A | 5/2006 |
| KR | 1020070009140 A | 1/2007 |
| KR | 100723527 B1 | 5/2007 |

* cited by examiner

*Primary Examiner* — Anita Alanko
(74) *Attorney, Agent, or Firm* — Kilpatrick Townsend & Stockton LLP

(57) ABSTRACT

A method for fabricating a semiconductor device with a vertical channel includes providing a substrate over which a hard mask pattern is formed, forming pillars over the substrate using the hard mask pattern thereby forming a resultant structure, forming an insulation layer over the resultant structure, planarizing the hard mask pattern and the insulation layer until the pillars are exposed, and forming a storage electrode over the exposed pillars.

14 Claims, 8 Drawing Sheets

METHOD FOR FABRICATING SEMICONDUCTOR DEVICE WITH VERTICAL CHANNEL

CROSS-REFERENCE TO RELATED APPLICATIONS

The present invention claims priority of Korean patent application number 2007-0062782, filed on Jun. 26, 2007, which is incorporated by reference in its entirety.

BACKGROUND OF THE INVENTION

The present invention relates to a method for fabricating a semiconductor device, and more particularly, to a method for fabricating a semiconductor device with a vertical channel.

A channel length of a transistor decreases as the integration of a semiconductor device increases. However, the decreased channel length of the transistor causes a short channel effect such as a drain induced barrier lowering (DIBL) phenomenon, a hot carrier effect, and a punch-through. To remove the short channel effect, various methods have been suggested such as decreasing a depth of a junction region and increasing a relative channel length by forming a recess in a channel region of the transistor.

However, as an integration density of a semiconductor memory device, particularly, a dynamic random access memory (DRAM), approaches giga bits, fabrication of a smaller transistor is required. In other words, the giga-bit scale DRAM transistor requires a device dimension under $8F^2$ (where F is a minimum feature size), and further, a device dimension size of about $4F^2$. Therefore, an existing planar transistor structure having a gate electrode over a substrate and junction regions on both sides of the gate electrode does not satisfy a required device dimension even though the channel length is scaled.

To overcome the above limitations, a vertical channel transistor has been introduced. A typical structure of a vertical channel transistor is disclosed in U.S. Patent Publication No. 2006-0097304 and Korean Patent No. 0723527.

FIG. 1 is a perspective view of a semiconductor device employing a conventional vertical channel transistor and FIG. 2 is a top view of the semiconductor device of FIG. 1.

Referring to FIGS. 1 and 2, a plurality of pillars P are formed over a substrate 100. The pillars include a substrate material and are arrayed in a first direction X-X' and a second direction Y-Y' crossing the first direction. The pillars are formed by etching the substrate 100 using a hard mask pattern (not shown).

One side of a unit cell region C has a feature size of 2F, i.e., a pitch in the first direction of the hard mask pattern, where F is the minimum feature size. The other side of the unit cell region C has a feature size of 2F, i.e., a pitch in the second direction of the hard mask pattern. As a result, a square feature size of the unit cell region C becomes $4F^2$. Even though the hard mask pattern has a square form, the pillar P is formed to have a cylindrical structure as the etch process proceeds.

A bit line 101, which extends in the first direction while surrounding corresponding pillars, is formed in the substrate 100 between each pair of neighboring pillars arranged in the first direction. The bit line 101 is divided by a device isolation trench T.

For each pillar P, a gate electrode (not shown) is formed on a circumferential surface of the pillar P to surround the pillar P. A word line 102 electrically connected to the surrounding gate electrode and extending in the second direction is formed.

A storage electrode 104 is formed over the pillar P. A contact plug 103 is interposed between the pillar P and the storage electrode 104.

When fabricating this semiconductor device, since the channel is formed vertical to the substrate surface, it is possible to increase the channel length regardless of the device dimension, resulting in prevention of the short channel effect. Also, since the gate electrode is formed surrounding the circumferential surface of the pillar P, a channel width of the transistor is increased and, thus, an operation current of the transistor is improved.

However, in a process of forming the contact plug 103 and the storage electrode 104 over the pillar P, a limitation on the process occurs and causes device failure. This limitation is explained in detail referring to FIGS. 3A to 3D, hereinafter.

FIGS. 3A to 3D are cross-sectional views of a method for fabricating the semiconductor device employing a conventional vertical channel transistor. Particularly, FIGS. 3A to 3D are cross-sectional views obtained from FIGS. 1 and 2 in the second direction. These figures are for explaining limitations in the process of forming the contact plug and the storage electrode over the pillar and, therefore, a detailed description of unrelated parts is omitted.

FIG. 3A shows a substrate structure including a substrate 300 having a plurality of pillars arranged in the first and the second directions. A hard mask pattern 305 is formed over each pillar P. A bit line 301 is extended in the first direction while surrounding the pillar P in the substrate 300 between a pair of neighboring pillars arranged in the first direction and divided by a device isolation trench T. A first insulation layer 303 fills a part of the trench T. A gate electrode 304 surrounds a circumferential surface of a lower portion of the pillar P. A word line 302 extends in the second direction and connects to the surrounding gate electrode 304.

Referring to FIG. 3B, a second insulation layer 306 is formed over the resultant structure of FIG. 3A and is planarized through, e.g., by a chemical mechanical polishing (CMP) process, until the hard mask pattern 305 is exposed.

Referring to FIG. 3C, an opening unit 307 is formed by selectively removing the exposed hard mask pattern 305 to expose a surface of the pillar P. Since the hard mask pattern 305 generally includes a nitride layer, the removal of the hard mask pattern 305 is performed by a wet etch using, e.g., a phosphoric acid.

Although not shown, a spacer and a pad layer including an oxide layer are formed on a sidewall and a lower portion of the hard mask pattern 305, respectively. Therefore, after the hard mask pattern 305 is removed, processes for removing the spacer and the pad layer are performed to expose the surface of the pillar P.

Referring to FIG. 3D, a plug material is filled in the opening unit 307 to form a contact plug 308 that is electrically connected to the pillar P.

Then, a storage electrode (not shown) is formed over the contact plug 308.

In the above process, when performing the wet etch process using the phosphoric acid, a possibility of damaging the spacer made of the oxide layer on the sidewall increases. When the spacer is damaged, in a subsequent process for removing the spacer and the pad layer, the second insulation layer 306 may also be damaged. Thereafter, an electrical short between the contact plug 308 and the word line 302 or the surrounding gate electrode 304 may occur and cause device failure.

Also, after removing the hard mask pattern 305, forming the contact plug 308 and the storage electrode in the remaining space may complicate the method for fabricating the semiconductor device.

SUMMARY OF THE INVENTION

Embodiments of the present invention are directed to providing a method for fabricating a semiconductor device with a vertical channel. Device failure is prevented when forming a storage electrode over a pillar of the vertical channel and the related fabrication process is simplified.

In accordance with an aspect of the present invention, there is provided a method for fabricating a semiconductor device with a vertical channel transistor. The method includes providing a substrate over which a hard mask pattern is formed, forming pillars over the substrate using the hard mask pattern thereby forming a resultant structure, forming an insulation layer over the resultant structure, planarizing the hard mask pattern and the insulation layer until the pillars are exposed, and forming a storage electrode over the exposed pillars.

In accordance with another aspect of the present invention, there is provided a method for fabricating a semiconductor device with a vertical channel. The method includes providing a substrate having a plurality of hard mask patterns arranged in a first direction and a second direction crossing the first direction, etching the substrate using one hard mask pattern as an etch mask to form an upper pillar portion, forming a spacer on a sidewall of the upper pillar portion, etching the substrate using one hard mask pattern and the spacer as an etch mask to form a lower pillar portion connected to the upper pillar portion, wherein the upper pillar portion and the lower pillar portion constitute a pillar, a plurality of pillars being arranged in the first and the second directions, recessing a sidewall of the lower pillar portion using the spacer as an etch barrier, forming a gate electrode surrounding a circumferential surface of the recessed lower pillar portion, forming a bit line impurity region in the substrate between a pair of neighboring pillar lines, each pillar line including pillars arranged in the first direction, forming a trench penetrating the bit line impurity region in the substrate between the pair of neighboring pillar lines to define a buried bit line which extends in the first direction and surrounds the pillars of the pair of neighboring pillar lines, wherein a first resultant structure is formed, forming a word line which extends in the second direction and is connected to the gate electrode, wherein a second resultant structure is formed, forming a fourth insulation layer over the second resultant structure, planarizing the fourth insulation layer until the upper pillar portion is exposed, and forming a storage electrode over the exposed upper pillar portion.

In accordance with another aspect of the present invention, there is provided a method for fabricating a semiconductor device with a vertical channel. The method includes providing a substrate having a hard mask pattern, etching the substrate using the hard mask pattern as an etch mask to form an upper pillar portion, forming a spacer on a sidewall of the upper pillar portion, etching the substrate using the hard mask pattern and the spacer as an etch mask to form a lower pillar portion connected to the upper pillar portion, wherein the upper pillar portion and the lower pillar portion constitute a pillar, recessing a sidewall of the lower pillar portion using the spacer as an etch barrier, forming a gate electrode surrounding a circumferential surface of the recessed lower pillar portion, forming a bit line impurity region in the substrate between a pair of neighboring pillar lines, each pillar line including pillars arranged in a first direction, forming a trench penetrating the bit line impurity region in the substrate between the pair of neighboring pillar lines to define a buried bit line which extends in the first direction and surrounds the pillars of the pair of neighboring pillar lines, wherein a first resultant structure is formed, forming a word line which extends in a second direction and is connected to the gate electrode, wherein a second resultant structure is formed, forming a fourth insulation layer over the second resultant structure, planarizing the fourth insulation layer until the upper pillar portion is exposed, and forming a storage electrode over the exposed upper pillar portion.

DESCRIPTION OF SPECIFIC EMBODIMENTS

Embodiments of the present invention are directed to a method for fabricating a semiconductor device with a vertical channel. The method prevents device failure when forming a storage electrode over a pillar of the vertical channel and simplifies the related fabrication process.

Figure 1:
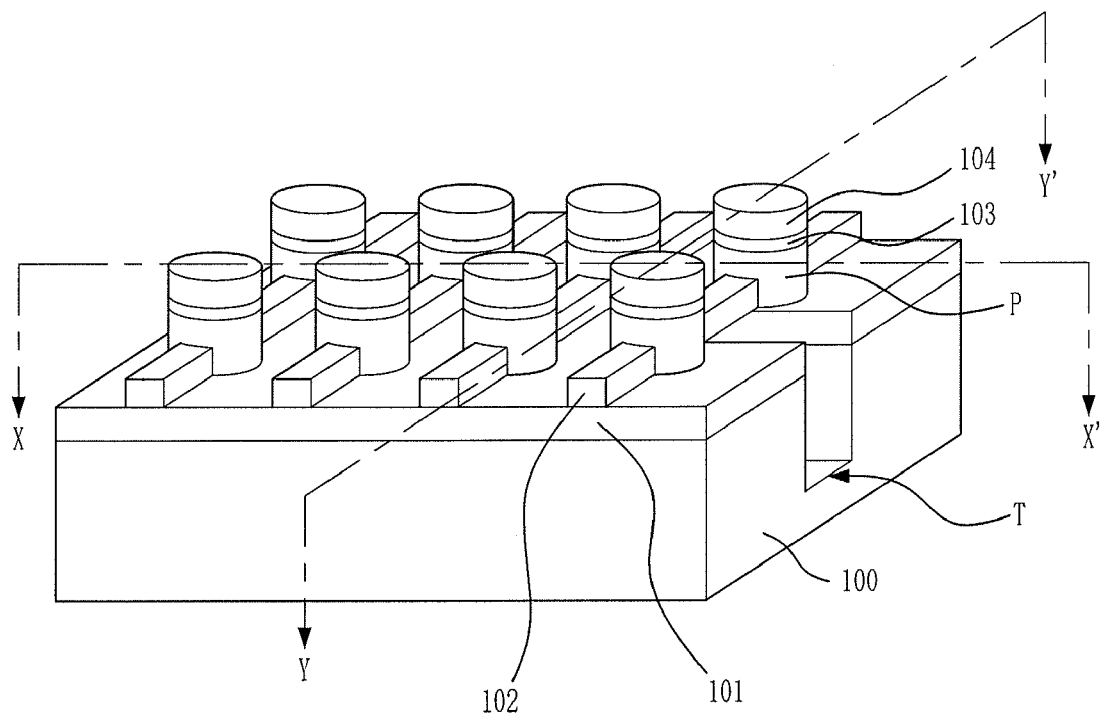
FIG. 1 is a perspective view of a semiconductor device including a conventional vertical channel transistor.
Figure 2:
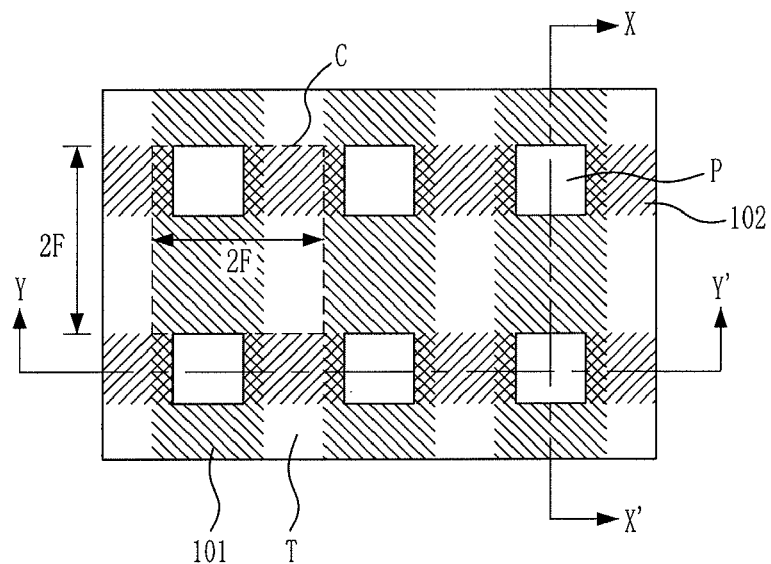
FIG. 2 is a top view of the semiconductor device of FIG. 1.
Figure 3A:
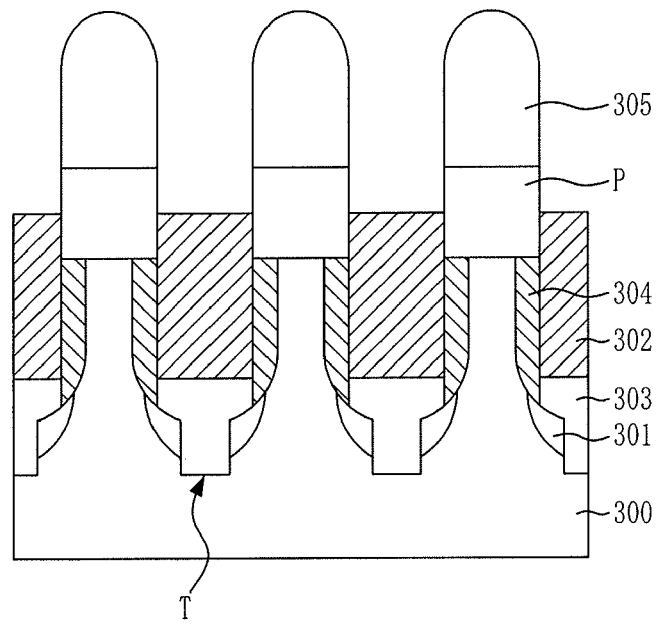
FIG. 3A is a cross-sectional view illustrating an initial step of a method for fabricating the semiconductor device including a conventional vertical channel transistor.
Figure 3B:
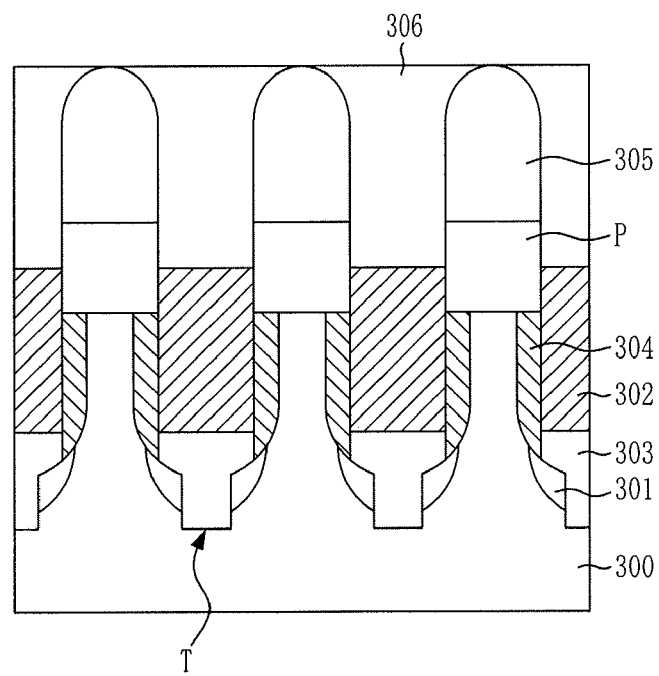
FIG. 3B is a cross-sectional view illustrating a subsequent step following FIG. 3A.
Figure 3C:
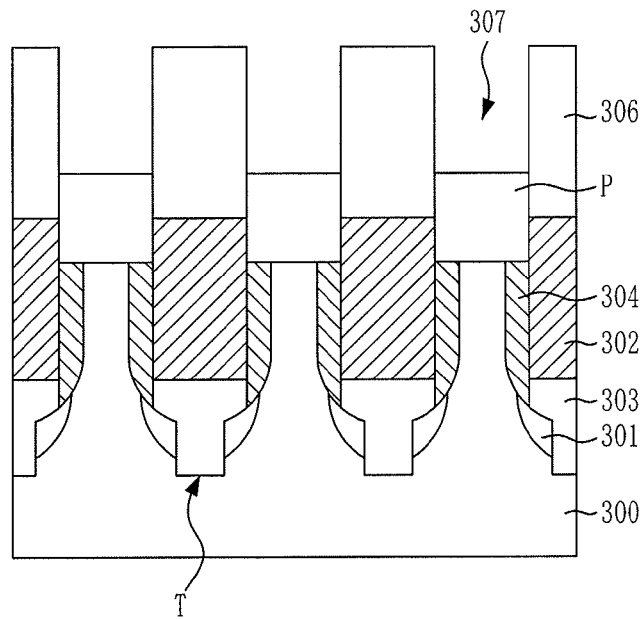
FIG. 3C is a cross-sectional view illustrating a subsequent step following FIG. 3B.
Figure 3D:
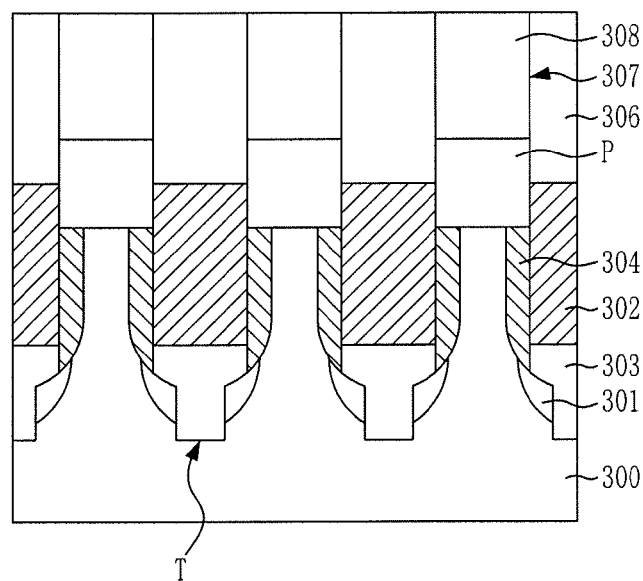
FIG. 3D is a cross-sectional view illustrating a subsequent step following FIG. 3C.

FIGS. 4A to 4I are cross-sectional views of a method for fabricating a semiconductor device including a vertical channel in accordance with an embodiment of the present invention. The cross-sectional views of FIGS. 4A to 4I are obtained by cutting the semiconductor device in a second direction, e.g., the Y-Y' axis shown in FIGS. 1 and 2.

Figure 4A:
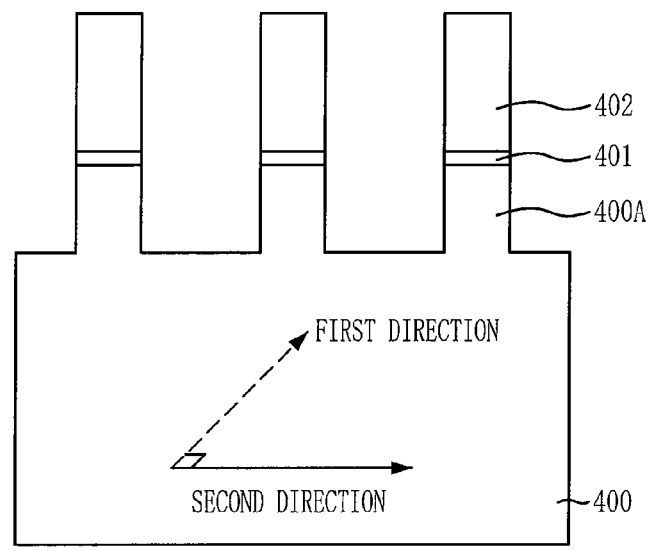
FIG. 4A is a cross-sectional view views of a method for fabricating a semiconductor device including a vertical channel transistor in accordance with an embodiment of the present invention.

Referring to FIG. 4A, a hard mask pattern 402 arranged in a first direction and the second direction crossing the first direction is formed over a substrate 400. A pad oxide layer 401 is formed under the hard mask pattern 402. The hard mask pattern 402 may include a nitride layer. The hard mask pattern 402 is formed to have a thickness of approximately 2,000 Å.

The substrate 400 is etched a predetermined depth using the hard mask pattern 402 as an etch mask to form an upper portion of a pillar, i.e., an upper pillar portion 400A. The upper pillar portion 400A may become a source region by a subsequent impurity implantation process. As a result, the upper pillar portion 400A may be connected to a subsequently formed storage electrode. Since the upper pillar portion 400A is partially removed in a subsequent planarization process (refer to FIG. 4I), the upper pillar portion 400A is formed to have a height greater than a desired resultant height. In one embodiment, the upper pillar portion 400A is initially formed to have a height of approximately 1,100 Å.

Figure 4B:
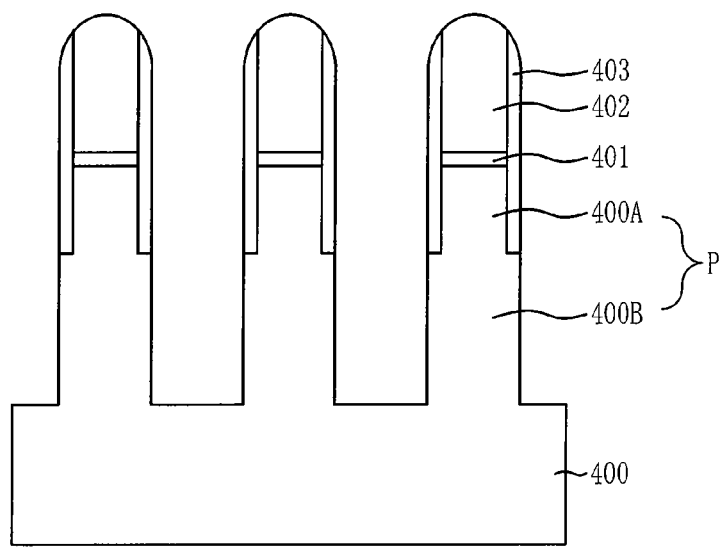
FIG. 4B is a cross-sectional view illustrating a subsequent step following FIG. 4A.

Referring to FIG. 4B, a material layer for a spacer is formed over the resultant structure of FIG. 4A. An etch-back process is performed on the material layer to form a spacer 403 on sidewalls of the hard mask pattern 402 and the upper pillar portion 400A.

The substrate 400 is etched a certain depth using the hard mask pattern 402 and the spacer 403 as an etch mask to form a lower portion of the pillar, i.e., a lower pillar portion 400B. The lower pillar portion 400B is connected to the upper pillar portion 400A. The lower pillar portion 400B may be a channel region.

Through the above processes, a pillar P is formed in an active region, including the lower pillar portion 400B and the upper pillar portion 400A. A plurality of pillars is arranged in the first direction and the second direction crossing the first direction nearly perpendicularly. Although the hard mask pattern 402 has a square form, the pillar P may have a cylindrical form as a result subsequent etch processes.

Figure 4C:
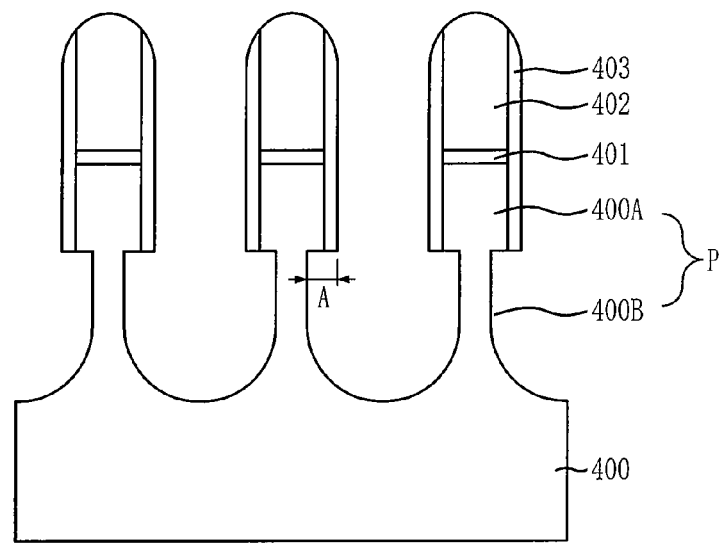
FIG. 4C is a cross-sectional view illustrating a subsequent step following FIG. 4B.

Referring to FIG. 4C, the sidewall of the lower pillar 400B is isotropically etched and recessed a width A using the hard mask pattern 402 and the spacer 403 as an etch barrier. The width A of the recessed lower pillar portion 400B corresponds to an expected thickness of a subsequently formed gate electrode.

Figure 4D:
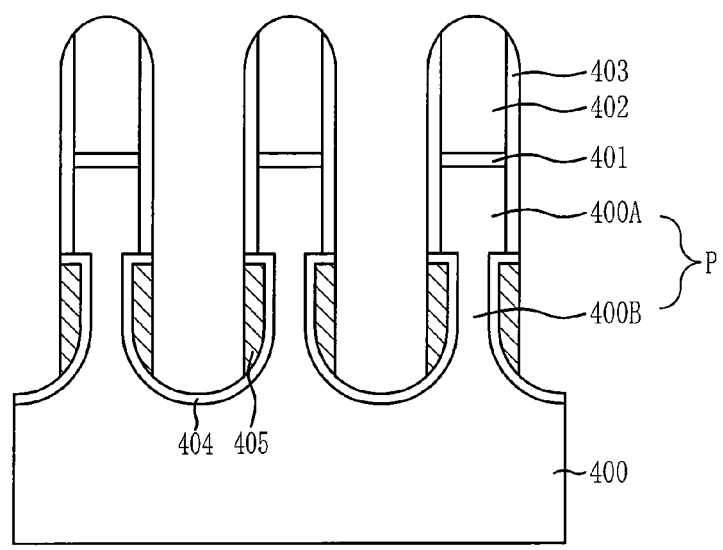
FIG. 4D is a cross-sectional view illustrating a subsequent step following FIG. 4C.

Referring to FIG. 4D, a first insulation layer 404 is formed over the exposed substrate 400. In one embodiment, the first insulation layer 404 is a gate insulation layer.

A conductive layer for a gate electrode, e.g., a polysilicon layer, is formed over the resultant structure and then etched until the first insulation layer 404 is exposed. Thus, a gate electrode 405 is formed to surround a circumferential surface of the lower pillar portion 400B.

Figure 4E:
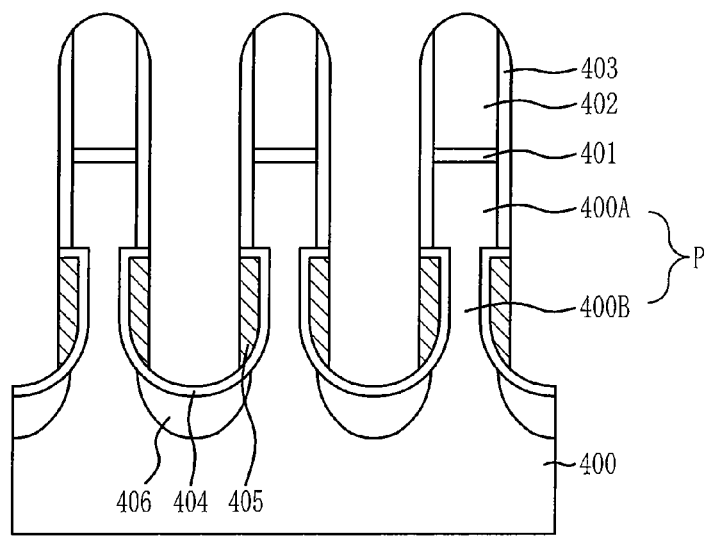
FIG. 4E is a cross-sectional view illustrating a subsequent step following FIG. 4D.

Referring to FIG. 4E, a bit line impurity region 406 is formed by implanting a bit line impurity into the substrate 400 between a pair of neighboring pillars P. The bit line impurity may be an n-type impurity.

Figure 4F:
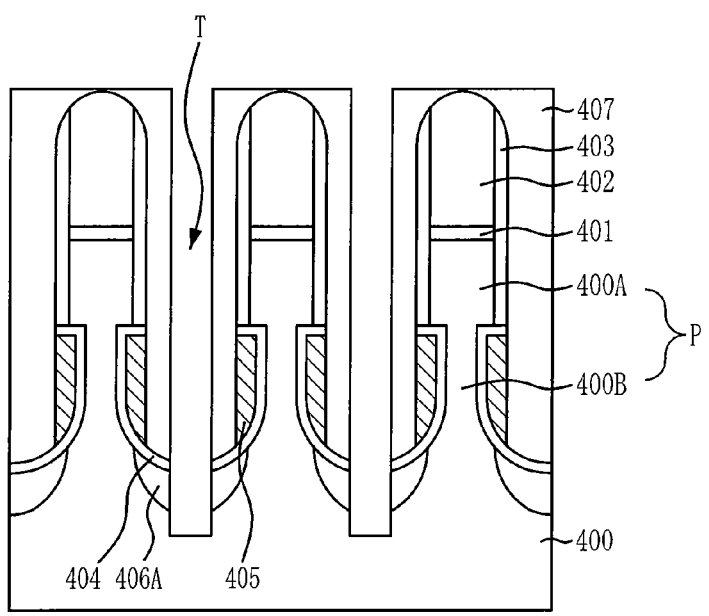
FIG. 4F is a cross-sectional view illustrating a subsequent step following FIG. 4E.

Referring to FIG. 4F, a second insulation layer 407 is formed over the resultant structure of FIG. 4E and is planarized.

A photoresist pattern (not shown) is formed over the planarized second insulation layer 407. The planarized second insulation layer 407 is etched using the photoresist pattern as an etch mask until the substrate 400 is exposed. The exposed substrate 400 is etched a certain depth. As a result, a device isolation trench T which extends in the first direction is formed in the substrate 400 between lines of the pillars arranged in the first direction. The trench T is formed with a depth such that the bit line impurity region 406 is penetrated. Accordingly, a buried bit line 406A extends in the first direction and surrounds the pillar P. A width of the trench T is less than a distance between the lines of the pillars arranged in the first direction.

Figure 4G:
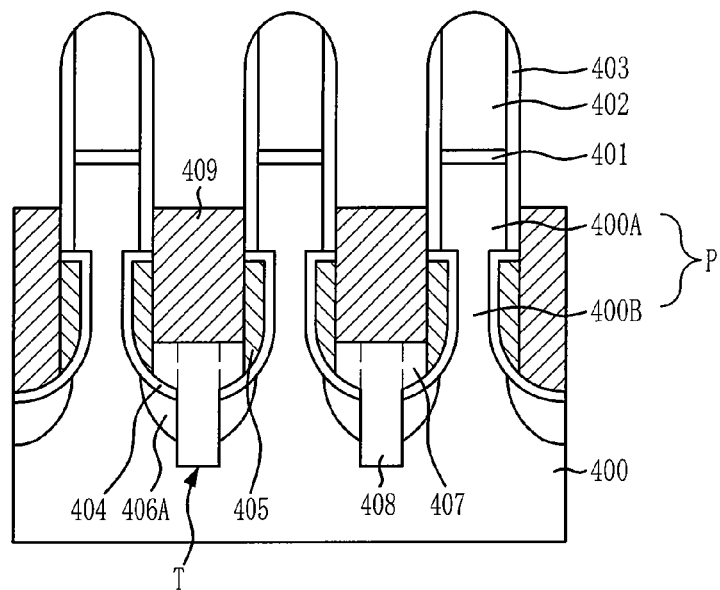
FIG. 4G is a cross-sectional view illustrating a subsequent step following FIG. 4F.

Referring to FIG. 4G, a third insulation layer 408 for filling the trench T is formed over the resultant structure of FIG. 4F. The third insulation layer 408 and the second insulation layer 407 are removed by an etch process until an upper portion of the surrounding gate electrode 405 is exposed. In this embodiment, the third insulation layer 408 is formed while the second insulation layer 407 remains. In accordance with another embodiment, the second insulation layer 407 is removed before forming the third insulation layer 408.

A conductive layer for a word line is formed over the resultant structure and is etched to a certain extent from a top surface of the upper pillar portion 400A, thereby forming a word line 409. The word line 409 extends in the second direction and is electrically connected to the gate electrode 405.

Figure 4H:
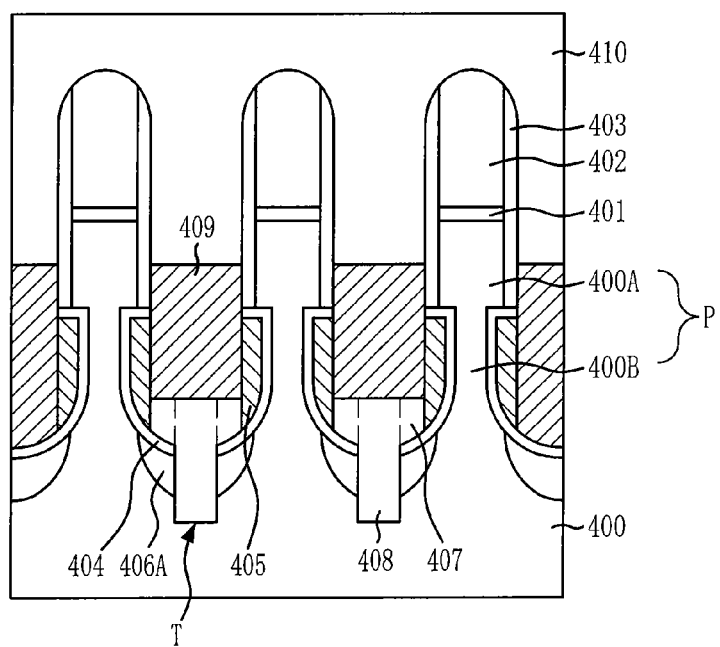
FIG. 4H is a cross-sectional view illustrating a subsequent step following FIG. 4G.

Referring to FIG. 4H, a fourth insulation layer 410 is formed over the resultant structure of FIG. 4G to isolate the pillars. It is preferable that the fourth insulation layer 410 includes an oxide layer. It is also preferable that the fourth insulation layer 410 includes a spin on dielectric (SOD) layer, a boron phosphorus silicate glass (BPSG) layer, or a high density plasma (HDP) layer having an excellent gap-fill characteristic.

As shown in the drawings, the layers formed over the upper pillar portion 400A, i.e., the pad oxide layer 401, the hard mask pattern 402, the spacer 403, and the fourth insulation layer 410, are made of an insulation layer such as a nitride layer, an oxide layer and the like.

Figure 4I:
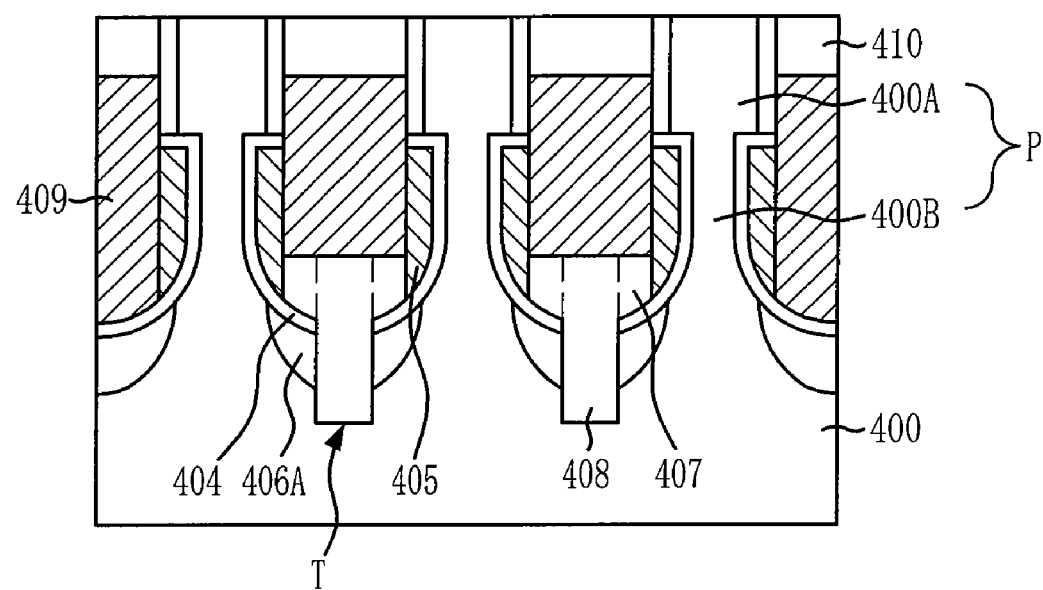
FIG. 4I is a cross-sectional view illustrating a subsequent step following FIG. 4H.

Referring to FIG. 4I, a planarization process is performed until the upper pillar portion 400A is exposed. The planarization process is accomplished through a CMP process. In the CMP process, there is no difference between an etch rate of the oxide layer and the etch rate of the nitride layer, and a high etch selectivity ratio of the insulation layer to the substrate 400 is high. Particularly, an over-polishing is desirable to completely expose the top surface of the upper pillar portion 400A when performing the CMP process.

In accordance with another embodiment, the planarization process may be performed through an etch process when the etch ratio of the oxide layer to the nitride layer is substantially 1:1 and the etch selectivity ratio of the insulation layer to the substrate 400 is high. Particularly, it is preferable to perform an over-etch process to completely expose the top surface of the upper pillar portion 400A during the etch process.

Although it is not shown, a storage electrode is formed directly connected to the exposed upper pillar portion 400A. The upper pillar portion 400A serves as a contact plug of the storage electrode. Before forming the storage electrode, an impurity implantation process may be further performed on the upper pillar portion 400A in order to reduce contact resistance.

In accordance with this embodiment of the present invention, the fabrication process is simplified by forming the storage electrode over the pillar without forming the contact plug. Furthermore, it is possible to prevent an electrical short between the word line and the storage electrode due to the loss of the insulation layer which may be caused when removing the hard mask pattern, the pad oxide layer and so on. As a result, the likelihood of device failure is reduced.

The method for fabricating a semiconductor device with a vertical channel transistor can simplify the fabrication process while preventing device failure when forming a storage electrode over an upper pillar portion.

While the present invention has been described with respect to specific embodiments, it will be apparent to those skilled in the art that various changes and modifications may be made without departing from the spirit and scope of the invention as defined in the following claims.

What is claimed is:

1. A method for fabricating a semiconductor device with a vertical channel, the method comprising:
   providing a substrate having a plurality of hard mask patterns arranged in a first direction and a second direction crossing the first direction;
   etching the substrate using one hard mask pattern as an etch mask to form an upper pillar portion;
   forming a spacer on a sidewall of the upper pillar portion;
   etching the substrate using one hard mask pattern and the spacer as an etch mask to form a lower pillar portion connected to the upper pillar portion, wherein the upper pillar portion and the lower pillar portion constitute a pillar, a plurality of pillars being arranged in the first and the second directions;
   recessing a sidewall of the lower pillar portion using the spacer as an etch barrier;
   forming a gate electrode surrounding a circumferential surface of the recessed lower pillar portion;
   forming a bit line impurity region in the substrate between a pair of neighboring pillar lines, each pillar line including pillars arranged in the first direction;
   forming a trench penetrating the bit line impurity region in the substrate between the pair of neighboring pillar lines to define a buried bit line which extends in the first direction and surrounds the pillars of the pair of neighboring pillar lines, wherein a first resultant structure is formed;
   forming a word line which extends in the second direction and is connected to the gate electrode, wherein a second resultant structure is formed;
   forming a fourth insulation layer over the second resultant structure;
   planarizing the fourth insulation layer until the upper pillar portion is exposed; and
   forming a storage electrode over the exposed upper pillar portion, wherein the storage node directly contacts the exposed upper pillar portion.

2. The method as recited in claim 1, wherein a pad oxide layer is interposed between the hard mask patterns and the upper pillar portion.

3. The method as recited in claim 1, wherein the height of the hard mask patterns is approximately 2,000 Å and the height of the upper pillar portion is approximately 1,100 Å.

4. The method as recited in claim 1, wherein forming the gate electrode includes:
   forming a first insulation layer over the substrate exposed after the recessing, wherein a third resultant structure is formed;
   forming a conductive layer for a gate electrode over the third resultant structure; and
   etching the conductive layer until the first insulation layer is exposed.

5. The method as recited in claim 1, wherein forming the word line includes:
   forming a third insulation layer over the first resultant structure and filling the trench;
   etching the third insulation layer until a part of the gate electrode is exposed, wherein a fourth resultant structure is formed;
   forming a conductive layer for a word line over the fourth resultant structure; and
   etching the conductive layer a certain extent from a top surface of the pillar.

6. The method as recited in claim 1, wherein each hard mask pattern includes a nitride layer; the spacer includes an oxide layer and a nitride layer; and the fourth insulation layer includes an oxide layer.

7. The method as recited in claim 6, wherein the fourth insulation layer includes one of a spin on dielectric (SOD) layer, a boron phosphorus silicate glass (BPSG) layer, and a high density plasma (HDP) layer.

8. The method as recited in claim 1, wherein the planarizing is performed by at least one of a CMP process or an etch process.

9. The method as recited in claim 8, wherein when the CMP process is performed, there is no difference between an etch rate of the fourth insulation layer and an etch rate of the hard mask pattern, and an etch selectivity ratio of the fourth insulation layer to the pillar is high.

10. The method as recited in claim 8, wherein the CMP process is performed until a top surface of the pillar is exposed.

11. The method as recited in claim 8, wherein when the etch process is performed, an etch ratio of the fourth insulation layer to the hard mask pattern is substantially 1:1 and an etch selectivity ratio of the fourth insulation layer to the pillar is high.

12. The method as recited in claim 8, wherein the etch process is performed until a top surface of the pillar is exposed.

13. The method as recited in claim 1, further comprising, before forming the storage electrode, implanting impurities into the exposed upper pillar portion.

14. A method for fabricating a semiconductor device with a vertical channel, the method comprising:
   providing a substrate having a hard mask pattern;
   etching the substrate using the hard mask pattern as an etch mask to form an upper pillar portion;
   forming a spacer on a sidewall of the upper pillar portion;
   etching the substrate using the hard mask pattern and the spacer as an etch mask to form a lower pillar portion connected to the upper pillar portion, wherein the upper pillar portion and the lower pillar portion constitute a pillar;
   recessing a sidewall of the lower pillar portion using the spacer as an etch barrier;
   forming a gate electrode surrounding a circumferential surface of the recessed lower pillar portion;
   forming a bit line impurity region in the substrate between a pair of neighboring pillar lines, each pillar line including pillars arranged in a first direction;
   forming a trench penetrating the bit line impurity region in the substrate between the pair of neighboring pillar lines to define a buried bit line which extends in the first direction and surrounds the pillars of the pair of neighboring pillar lines, wherein a first resultant structure is formed;
   forming a word line which extends in a second direction and is connected to the gate electrode, wherein a second resultant structure is formed;
   forming a fourth insulation layer over the second resultant structure;
   planarizing the fourth insulation layer until the upper pillar portion is exposed; and
   forming a storage electrode over the exposed upper pillar portion, wherein the storage node directly contacts the exposed upper pillar portion.

* * * * *